(12) United States Patent
Willoughby

(10) Patent No.: US 9,548,005 B2
(45) Date of Patent: Jan. 17, 2017

(54) PERSONALIZED DISPLAY OF INTERCHANGEABLE CARDS

(71) Applicant: Gerald Willoughby, Santa Fe, NM (US)

(72) Inventor: Gerald Willoughby, Santa Fe, NM (US)

( * ) Notice: Subject to any disclaimer, the term of this patent is extended or adjusted under 35 U.S.C. 154(b) by 0 days.

(21) Appl. No.: 14/726,395

(22) Filed: May 29, 2015

(65) Prior Publication Data

US 2016/0351081 A1   Dec. 1, 2016

(51) Int. Cl.
  *G09F 1/12*   (2006.01)
  *A44C 5/00*   (2006.01)
  *H05K 5/02*   (2006.01)

(52) U.S. Cl.
  CPC .............. *G09F 1/12* (2013.01); *A44C 5/0007* (2013.01); *H05K 5/0247* (2013.01)

(58) Field of Classification Search
  CPC .............. A47G 1/065; G09F 1/10; G09F 1/12; G09F 15/0006
  See application file for complete search history.

(56) References Cited

U.S. PATENT DOCUMENTS

| | | | | |
|---|---|---|---|---|
| 2,345,719 A | * | 4/1944 | Weil, Jr. | A47G 1/14 40/733 |
| 2,590,744 A | * | 3/1952 | Woodbury | A47G 1/14 16/382 |
| 2,803,829 A | | 8/1957 | Tscharner | |
| 4,918,758 A | | 4/1990 | Rendina | |
| 5,359,734 A | | 11/1994 | Rathburn | |
| 5,452,479 A | | 9/1995 | Mostert | |
| 5,581,813 A | | 12/1996 | Henschel | |
| 5,862,523 A | | 1/1999 | Proctor | |
| 5,897,416 A | * | 4/1999 | Barrows | G09F 1/02 40/538 |
| 5,901,381 A | | 5/1999 | Nelson | |
| 5,974,713 A | * | 11/1999 | Wu | A47G 1/065 40/605 |
| 6,311,332 B1 | | 11/2001 | Lien | |
| 6,519,779 B1 | | 2/2003 | Taguchi | |
| 6,536,146 B2 | * | 3/2003 | Ericson | G09F 19/14 359/478 |
| 6,640,474 B2 | * | 11/2003 | Knoerzer | G09F 13/22 40/455 |
| 6,643,847 B1 | | 11/2003 | Dornak | |
| 7,243,377 B2 | | 7/2007 | Ashy | |
| D549,931 S | | 9/2007 | Melton | |
| 2005/0150035 A1 | * | 7/2005 | Marks | A41F 9/002 2/338 |
| 2012/0271212 A1 | | 10/2012 | Grisham-Algots | |
| 2012/0291179 A1 | | 11/2012 | Shea | |
| 2014/0096300 A1 | | 4/2014 | Ross et al. | |

FOREIGN PATENT DOCUMENTS

WO   2008032097 A1   3/2008

\* cited by examiner

*Primary Examiner* — Cassandra Davis
(74) *Attorney, Agent, or Firm* — Giaccio LLC; Anthony Giaccio

(57) ABSTRACT

Card holders for personalized and customized display of interchangeable cards are disclosed.

3 Claims, 18 Drawing Sheets

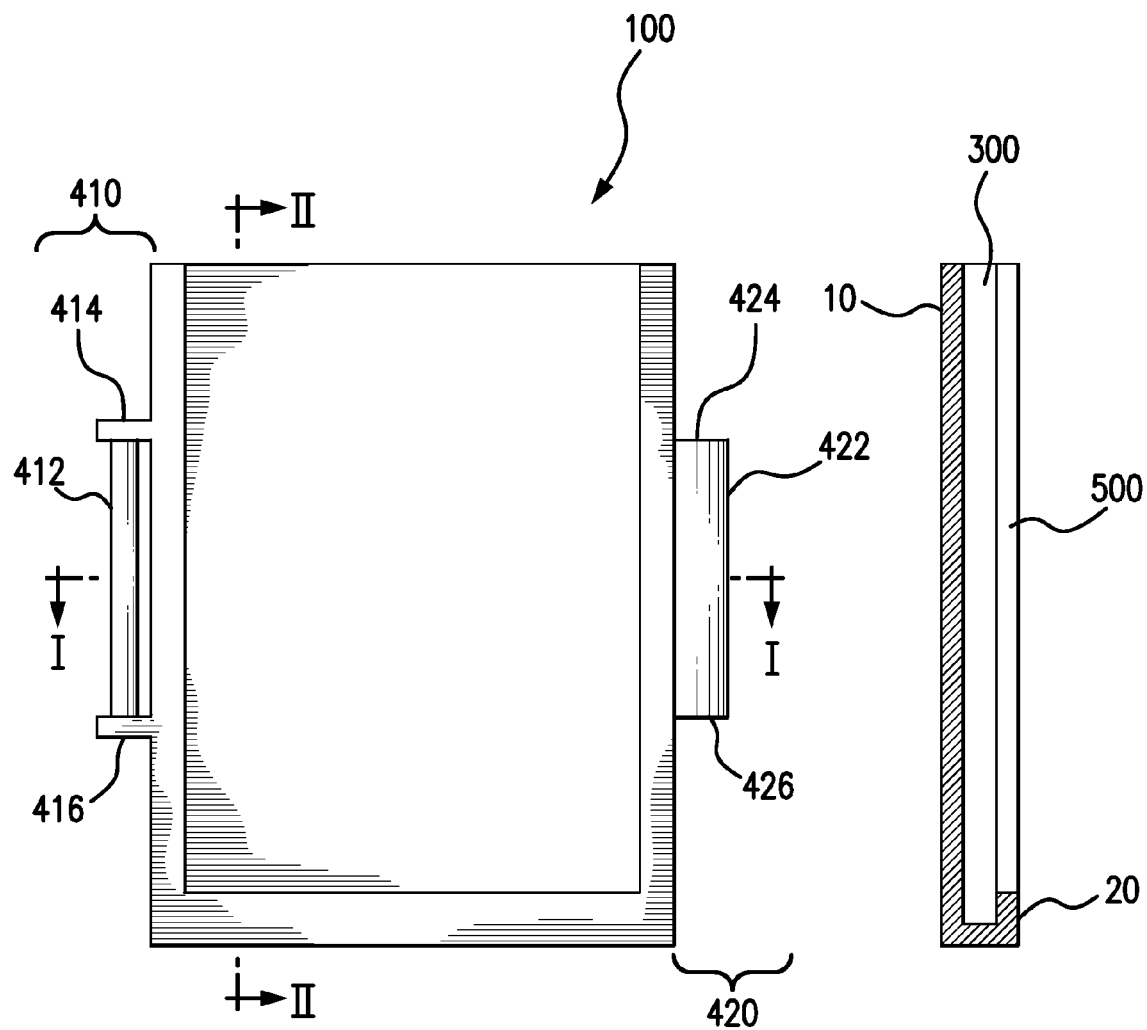
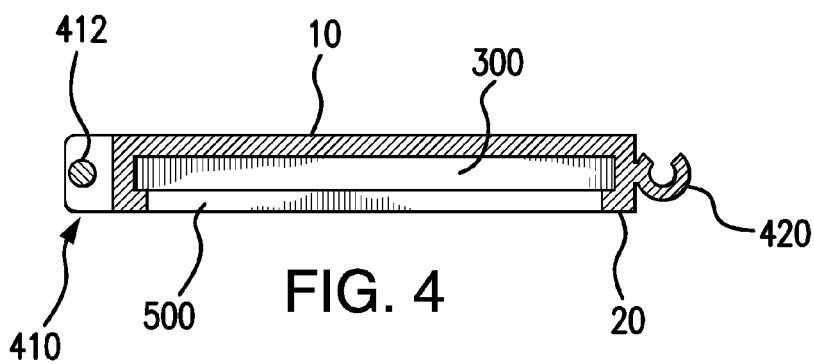

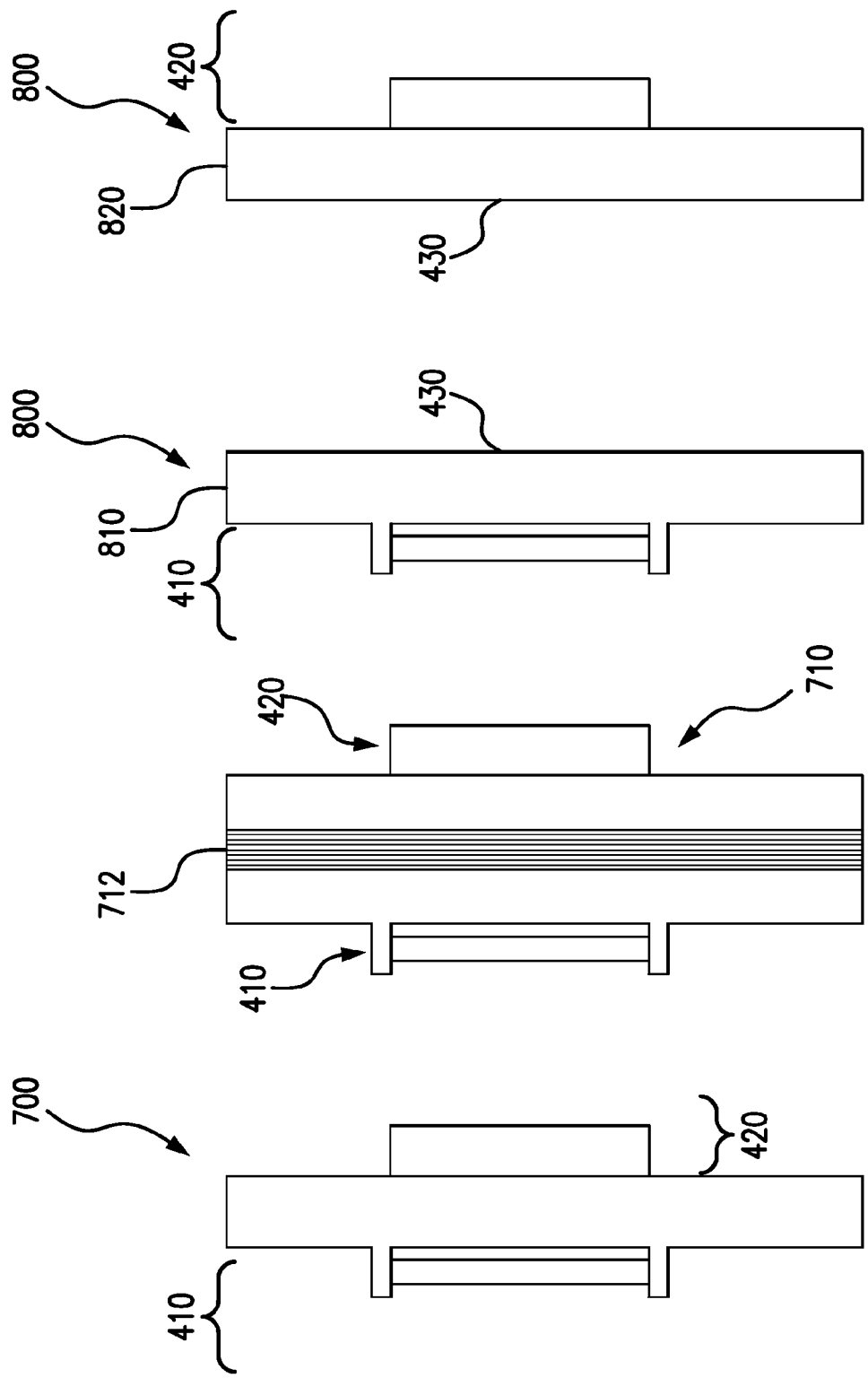

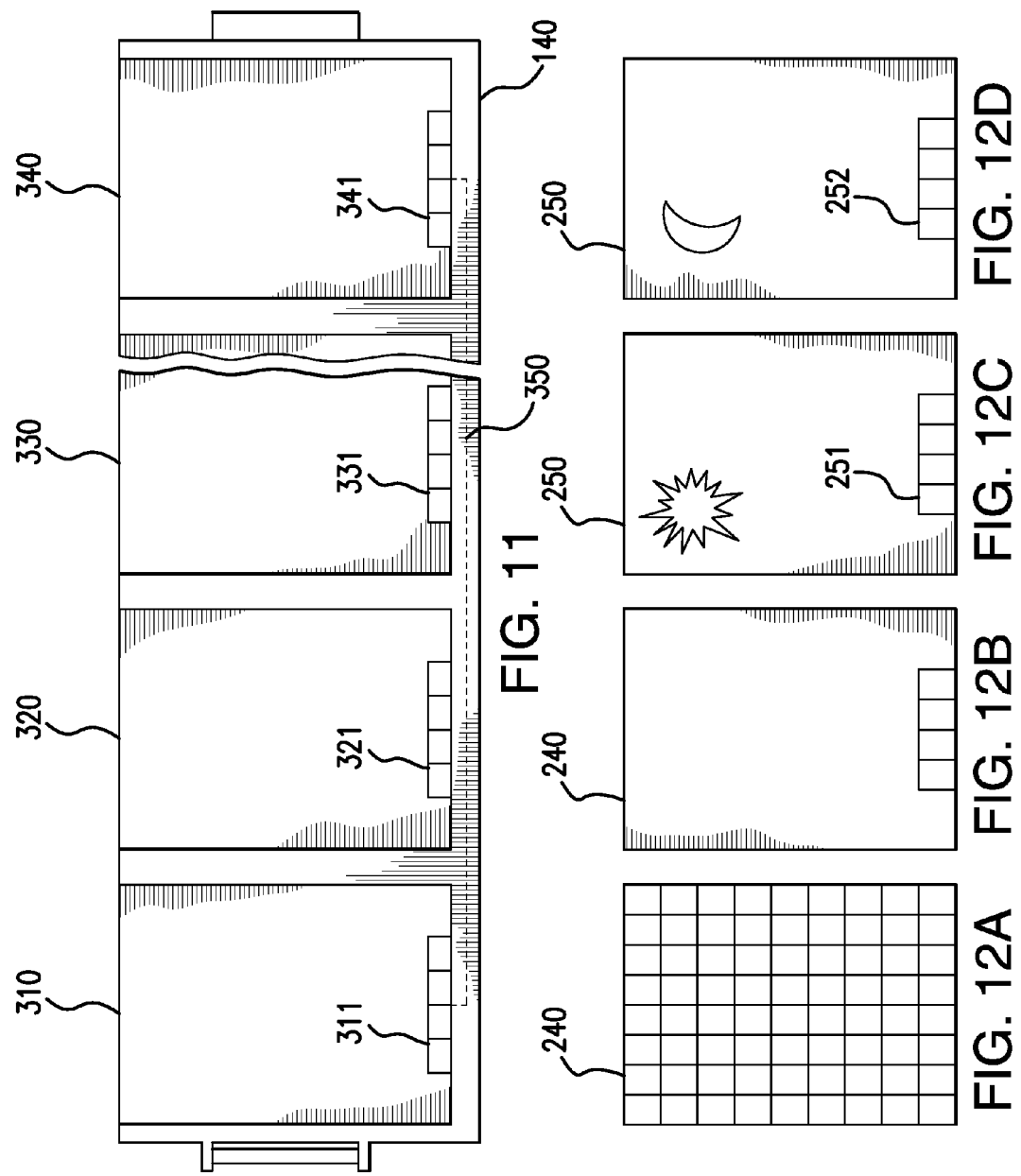

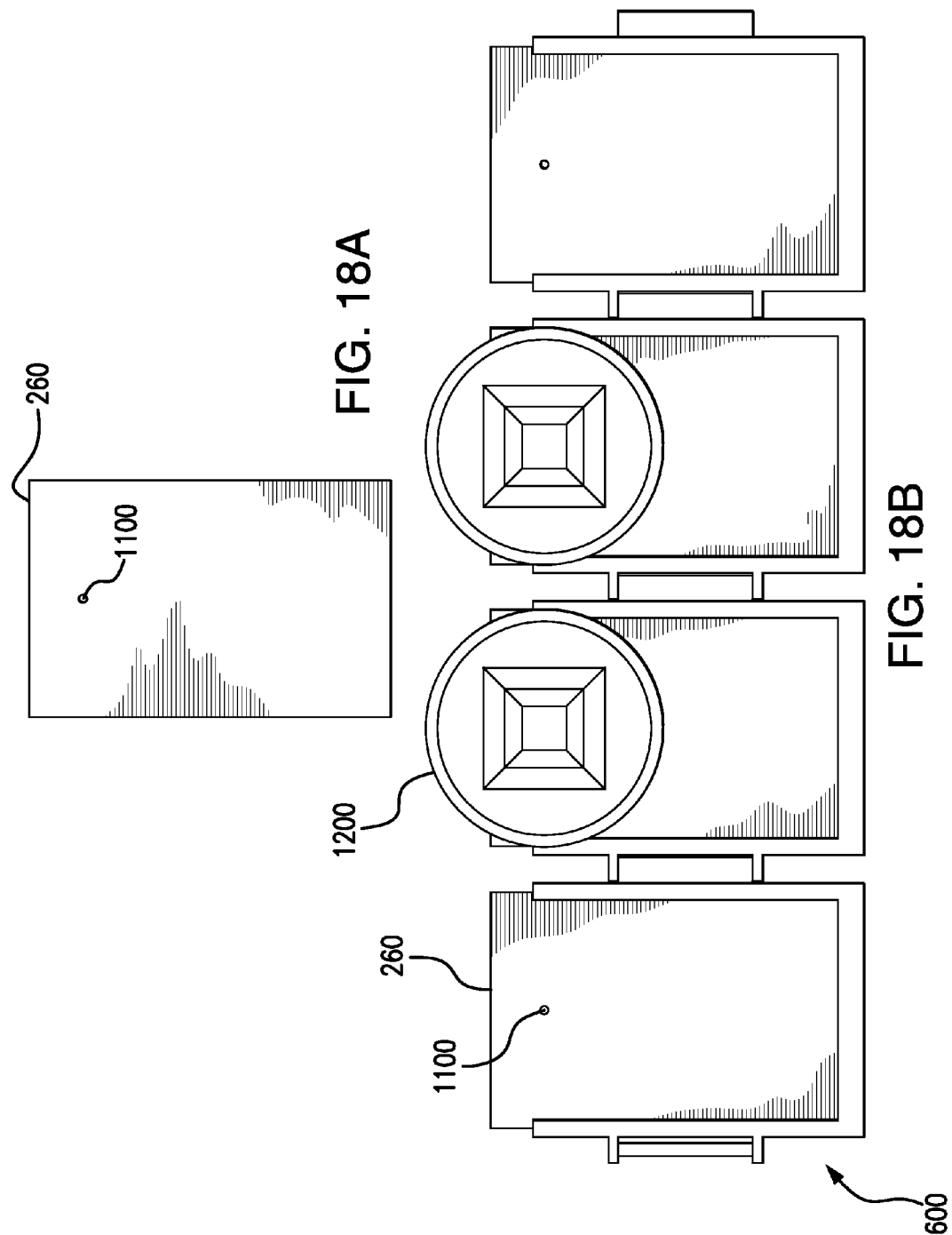

PERSONALIZED DISPLAY OF INTERCHANGEABLE CARDS

CROSS-REFERENCE TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

Field of the Invention

This invention generally relates to the personalized display of interchangeable cards.

Description of Related Art

U.S. Pat. No. 2,803,829 discloses a cap for displaying pictures in photograph retaining pockets.

U.S. Pat. No. 4,918,758 discloses a changeable message stretch band allowing the wearer to communicate words and expressions using removably attached graphics.

U.S. Pat. No. 5,359,734 discloses a hat having an opening with a two part hook-and-pile fastening means with the first part of the fastening means around the periphery of the opening on the hat and the second part of the fastening means on cloth panels for the attachment and removal of the cloth panels to cover the opening in the hat.

U.S. Pat. No. 5,452,479 discloses a cap with a display pouch to hold a card-like article.

U.S. Pat. No. 5,581,813 discloses one or more transparent pockets secured to the outside or external surface of a cap to store and display at least one object.

U.S. Pat. No. 5,862,523 discloses a module headwear system to detachably couple components of a hat.

U.S. Pat. No. 5,901,381 discloses a decorative headband with an elastic and flexible band with a coupling mechanism mounted to the band for the mounting of a plurality of decorative attachments each removably attached to the coupling mechanism.

U.S. Pat. No. 6,311,332 discloses a hat with a window at a transparent frame installed at the front edge of the hat.

U.S. Pat. No. 6,519,779 discloses a customizable baseball cap having removable portions with indicia that may be replaced by alternate portions displaying alternate indicia.

U.S. Pat. No. 6,643,847 discloses a baseball cap with multiple pockets for the personalized placement of multiple logos, insignias, or text, wherein each see through plastic pocket is independent and allows the user to slip in personalized material through a flap.

U.S. Pat. No. 7,243,377 discloses a hat with interchangeable advertising media positioned on an exterior portion thereof.

U.S. Design Pat. No. D549,931 discloses an ornamental design for a cap having a strap partially secured to the sides of a baseball cap for holding food packages.

International PCT Application No. PCT/GB2007/003507 discloses an apparatus for playing a game of observation having a display unit that simultaneously displays a plurality of images that can be removed during the course of the game.

U.S. Patent Application 2012/0271212 discloses a lumbar back support belt with a thin stretchable top layer attached to the thicker bottom layer with a pocket sewn onto the top of the belt.

U.S. Patent Application 2012/0291179 discloses a garment body with a substantially transparent outer layer and an inner layer coupled to the outer layer by a plurality of seams forming pockets all over the garment body.

U.S. Patent Application 2014/0096300 discloses a bib with a transparent window and a back panel that forms a gap creating a pocket for the placement of decorative graphic designs.

BRIEF SUMMARY OF THE INVENTION

The present invention relates to a card holder for personalized display of interchangeable cards having a body portion with a first side, with a second side that is opposite of the first side, with a slot for slideably receiving the interchangeable card, and with an aperture for direct display of the interchangeable card, and having a pin and hook joinder mechanism connected to the body portion for joining one card holder to another card holder. The present invention further relates to a card holder wherein the pin and hook joinder mechanism comprises a pin joinder portion mounted to a first side of a body portion and a hook joinder portion mounted to a second side of the body portion; wherein the card holder and the interchangeable card are made of one or more of rigid plastic, flexible plastic, solid molded plastic, hollow molded plastic, polyester, polyethylene, polyethylene terephthalate, high density polyethylene, low density polyethylene, polystyrene, high impact polystyrene, polyamides, polyvinyl chloride, polypropylene, polycarbonate, polyurethane, polytetrafluroethylene, rubber, silicone, cotton, cardboard, paper, leather, metal, wood, glass, or ceramic; wherein the card holder and the interchangeable card are both made of the same materials; wherein the card holder and the interchangeable card are different colors; wherein the interchangeable card is an illumination interchangeable card powered by an internal battery; or wherein the body portion further has a raised dome that extends from the body portion into the slot.

The present invention relates to a method for personalized display of interchangeable cards comprising the steps of inserting an interchangeable card into a slot of a card holder having a first side, a second opposite side, and an aperture for the direct display of the interchangeable card in between the first and second sides, and joining the card holder to another card holder using a pin and hook joinder mechanism, wherein a pin joinder portion of the pin and hook joinder mechanism is mounted to the first side of the card holder and a hook joinder portion of the pin and hook mechanism is mounted to the second side of the card holder.

The present invention further relates to a method for personalized display of a wearable band comprising a plurality of card holders wherein a wearer places the band in contact with an article of clothing without mechanical attachment to the article of clothing; wherein the article of clothing is a hat, shirt, coat, pant, short, or shoe; wherein a wearer places the band in contact with a portion of the wearer's body; or wherein the portion of the wearer's body is a head, arm, torso or leg. The present invention further relates to a method for personalized display of interchangeable cards further comprising the step of accessorizing the interchangeable card.

The present invention relates to an array of card holders comprising two or more closer components having pin joinder portions or hook joinder portions capable of joining with the pin and hook joinder mechanism of the card holders.

The present invention relates to a card holder for personalized display of interchangeable cards comprising a body portion with a first side, with a second side opposite the first side, with two or more slots for slideably receiving interchangeable cards, and with two or more apertures for direct display of the two or more interchangeable cards, and having a pin and hook joinder mechanism connected to the body portion for joining the card holder to another card holder. The present invention further relates to a card holder wherein at least one slot is configured with one or more electrical contact pads for electrical contact with one or more electrical contact pads of an illumination interchangeable card; wherein at least one slot is configured with one or more electrical contact pads for electrical contact with at least one solar energy generating interchangeable card; or wherein the illumination interchangeable card is powered by an internal battery.

The present invention relates to a card holder for personalized display of interchangeable cards comprising a body portion with a first side, with a second side opposite the first side, with a slot for slideably receiving interchangeable cards, and with an aperture for direct display of the interchangeable card; and having a pin and hook joinder mechanism connected to the body portion for joining the card holder to another card holder, wherein a first electrical contact pad is located within the slot for electrical engagement with an interchangeable card having an electrical contact pad, a second electrical contact pad within the pin and hook joinder mechanism for electrical engagement with another card holder having an electrical contact pad, and the first electrical contact pad is electrically connected to the second electrical contact pad. The present invention further relates to an illumination interchangeable card powered by an internal battery.

The present invention relates to a card holder for personalized display of interchangeable cards having a body portion with a first side, with a second side, with a slot for slideably receiving the interchangeable card, and with an aperture for direct display of the interchangeable card; and having a joinder mechanism connected to the body portion for joining the card holder to another card holder. The present invention further relates to a card holder wherein the joinder mechanism is selected from the group consisting of one or more of a hook and loop mechanism, a pin and groove mechanism, or a snap mechanism.

BRIEF DESCRIPTION OF THE DRAWINGS

For a better understanding of the present invention, reference is made to the following examples and drawings. Referring to the appended drawings:

FIG. 3 is a front view of the card holder of FIG. 1;

FIG. 4 is a cross section view of the card holder of FIG. 3 along horizontal line I;

FIG. 5 is a cross section view of the card holder of FIG. 3 along vertical line II;

FIGS. 8A and 8B are front views of spacer components in accordance with non-limiting alternative embodiments of the present invention;

FIGS. 9A and 9B are front views of closer components in accordance with non-limiting alternative embodiments of the present invention;

FIG. 11 is a schematic front view of a single card holder having more than one slot for holding more than one interchangeable card with electrical contact pads for electrical connection to more than one interchangeable card in accordance with a non-limiting alternative embodiment of the present invention;

FIGS. 12A and 12B are front and rear views, respectively, of a solar energy generating interchangeable card in accordance with a non-limiting alternative embodiment of the present invention;

FIGS. 12C and 12D are front and rear views, respectively, of an interchangeable card capable of illumination in accordance with a non-limiting alternative embodiment of the present invention;

FIGS. 18A and 18B are front views of an interchangeable card and a wearable band of interchangeable cards, respectively, capable of displaying accessories in accordance with non-limiting alternative embodiments of the present invention.

Figure 2:
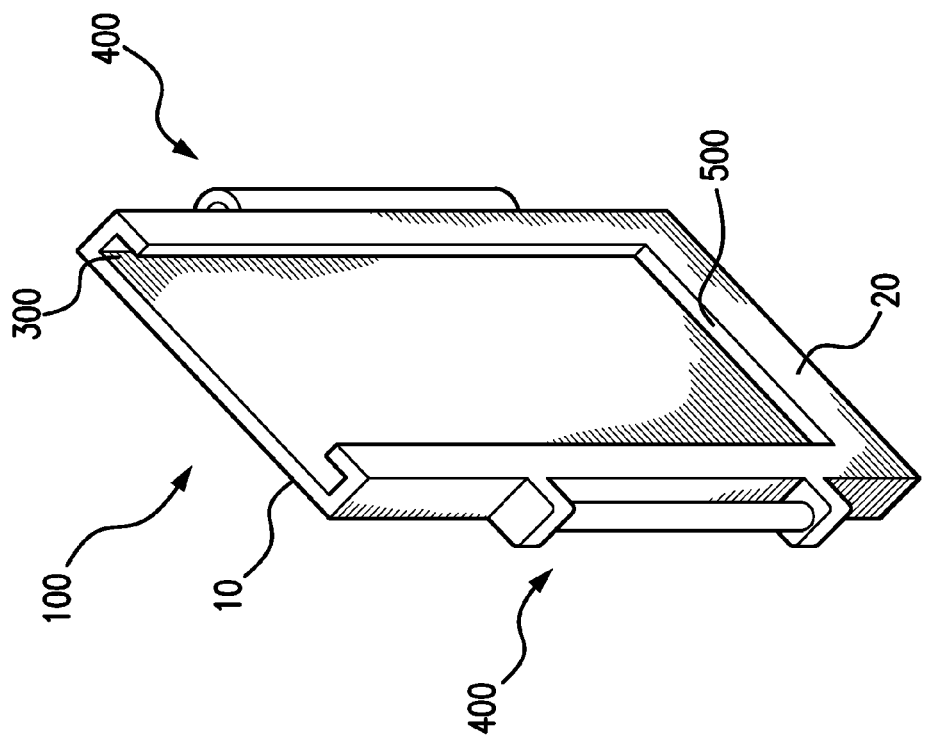
FIG. 2 is a right facing isometric view of the card holder of FIG. 1.

Other features and aspects of the present invention will become more fully apparent from the following detailed description of some example embodiments, the appended claims, and the accompanying drawings.

DETAILED DESCRIPTION OF THE PREFERRED EMBODIMENTS

The inventor has recognized a need for a new vehicle for self-expression and has developed a new system for self-expression that is flexible, easy, and fun.

An example embodiment of the present invention is a simple and elegant card holder that can be assembled easily into a wearable band. Each card holder can hold unique and interchangeable cards in order to personalize or customize the band.

A card holder in accordance with the present invention is designed to hold an easily interchangeable card so that a complicated fastening device or mechanism is not required to insert, remove, or replace the interchangeable card with another card. The interchangeable cards can even be ornamented on both sides so that the same interchangeable card can be easily removed, rotated, and reinserted to expose the other side of the card. The simple engagement between the card holder and interchangeable card allows an ease of use for individuals, particularly children, to interchange the cards and thereby personalize their display in accordance with individual preferences. Optionally, the card holder may have a mechanism for securing the interchangeable card to the card holder.

Each card holder has a slot for receiving an interchangeable card. The construction of the interchangeable cards can vary widely as long as the card is able to slide into the receiving slot of the card holder. The dimensions of the slot allow for a snug fit of the interchangeable card when inserted into the slot. In a preferred embodiment of the card holder, the opening for receiving interchangeable cards into the slot is located at the top of the card holder. Also, in a preferred embodiment of the card holder, once the interchangeable card is inserted into the slot the interchangeable card is directly exposed for viewing.

Each card holder is designed to easily connect to other card holders to form a band. This feature multiplies the fun by providing the ability to make bands of any length and by multiplying the expression of numerous interchangeable cards that can be mixed and matched according to personal preferences. These benefits derive from the special design of each card holder having a joinder mechanism so that it can be joined easily with other card holders. Because the card holders are easily joined together, it is possible to form the band of card holders into a ring. No integral fastening device is required to attach the card holders to one another for the personalized display of interchangeable cards nor is an integral fastening device required to attach the card holder to anything else, like an article of clothing.

The card holders are joined together through the engagement of each card holders' respective joinder portion. In a preferred embodiment of the present invention, the joinder mechanism is a pin and hook mechanism. In alternative non-limiting embodiments of the invention, the joinder mechanism may be for example a hook and loop mechanism, a pin and groove mechanism, or a snap mechanism.

Card holders of the present invention are easily coupled to and uncoupled from each other. Coupling with a pin and hook mechanism allows for a degree of pivoting between card holders so that a band of card holders can be formed into a generally circular shape.

In a preferred embodiment of the invention, each card holder has a pin joinder portion on one side of the body of the card holder and a hook joinder portion on a second side that is opposite of the first side so that the card holder can interlock with other card holders in a secure manner that also permits a degree of pivoting between the card holders. The joinder portions on opposite sides of the card holder allow the card holders to be linked to one another and, if formed into a closed loop can be worn, for example, on a hat or around the waist without any need to attach the card holder to the hat or article of clothing around the end user's head or waist.

In accordance with the present invention, the card holder is made of one or more of rigid plastic, flexible plastic, solid molded plastic, hollow molded plastic, polyester, polyethylene, polyethylene terephthalate, high density polyethylene, low density polyethylene, polystyrene, high impact polystyrene, polyamides, polyvinyl chloride, polypropylene, polycarbonate, polyurethane, polytetrafluroethylene, rubber, silicone, cotton, cardboard, paper, leather, metal, wood, glass, or ceramic.

In accordance with the present invention, the interchangeable card is made of one or more of rigid plastic, flexible plastic, solid molded plastic, hollow molded plastic, polyester, polyethylene, polyethylene terephthalate, high density polyethylene, low density polyethylene, polystyrene, high impact polystyrene, polyamides, polyvinyl chloride, polypropylene, polycarbonate, polyurethane, polytetrafluroethylene, rubber, silicone, cotton, cardboard, paper, leather, metal, wood, glass, or ceramic.

The simplicity of each component being made of the same material increases the user's experience in coupling the card holders to one another and in interchanging the various cards. In alternative non-limiting embodiments of the invention, the card holder and the interchangeable cards can be made of the same or different materials. The card holder and the interchangeable cards are preferably made in a variety of different colors and decorative designs, which may match or contrast with each other.

The interchangeable cards can vary in size and shape. In a preferred embodiment of the invention, the cards are 2 inch square with straight edges on all sides. However, it is also contemplated that in other non-limiting embodiments of the invention, the cards may be of a variety of shapes and sizes, such as generally rectangular in shape with straight edges on all sides, generally rectangular in shape with straight edges on three sides while the fourth, top side is a shape other than straight, etc. For example, the top edge of the card may have a curved edge in the form of a dome, the top edge of the card may have a pointed edge in the form of a triangle, the top edge of the card may have the curved shape of a wave, or the top edge of the card may have the shape of the profile of a building or other structure. The top edge of the card has the greatest flexibility to be made in any preferred shape.

Each card is interchangeable, easy to slide into and out of the card holders, and therefore can be switched from card holder to card holder with ease within the same band or tradable with others for switching with the band of another. Optionally, the interchangeable card may have a mechanism for securing the card to a card holder.

The interchangeable cards may be illustrated with a variety of themes (flags, nationalities, holidays, special days, pets, animals, vocations, careers, sports teams, emblems, colors, numbers, letters, toys, recreations, hobbies, trucks, cars, boats, glamor, celebrities, characters, etc.) all designed to maximize the individual's ability to establish a unique identity of the product and maximize their individuality. These illustrations can be integral in the card itself or applied as a sticker or shrink wrap to the card. In alternative non-limiting embodiments of the invention, the illustrations may be in relief, such as carved into the surface or raised from the surface of the card. In alternative non-limiting embodiments of the invention, the interchangeable cards are further accessorized by the attachment of one or more accessories to the interchangeable card.

Optionally, the cards are reversible such that the user can remove, turn, and replace the same card in the same holder then displaying the reverse face of the card. Optionally, the cards are capable of illumination of the whole or part of the card and powered by an internal battery or other power source.

The cards may or may not have pre-printed images, allowing for the flexibility of the end user designing the end user's own cards with photos, drawings, artistic inventions, collectibles, and/or stickers, for example.

Figure 1:
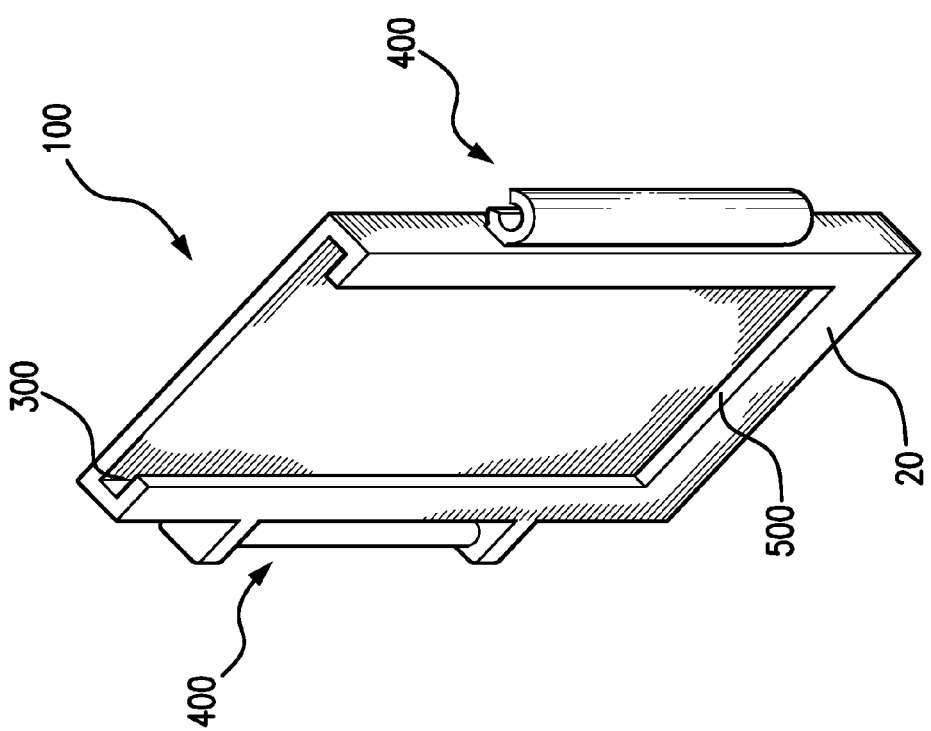
FIG. 1 is a left facing isometric view of a card holder in accordance with a non-limiting embodiment of the present invention.

FIG. 1 illustrates a preferred card holder 100 in a left facing isometric view and FIG. 2 illustrates the same preferred card holder 100 in a right facing isometric view to showcase the design of the interchangeable card slot 300 of the body of the card holder and the preferred pin and hook joinder mechanism 400 in accordance with the present invention. The opening for receiving interchangeable cards 200, 210, 220, 230, 240, 250 into the slot 300 is located at the top of the body of the card holder in this preferred embodiment. The body of the card holder has a back portion 10 and a front portion 20. There is also an aperture 500 in the front portion 20 of the body of the card holder that leaves exposed the interchangeable card for viewing after insertion into the card holder.

The preferred pin and hook joinder mechanism 400 is illustrated in FIG. 3 to show the pin joinder portion 410 on one side of the card holder and the hook joinder portion 420 on the opposite side of the card holder. The pin 412 is held in place by an upper plate 414 and a lower plate 416. These upper and lower plates 414, 416 also contact the upper hook edge 424 and the lower hook edge 426 of a mating hook 422 of another card holder when the mating hook 422 of another card holder engages the pin 412 of the card holder. This adds to the stability of the coupling between the card holders. The height of the pin 412 and the height of the hook 422 (between the upper hook edge 424 and lower hook edge 426) may vary in alternative non-limiting embodiments of the invention. The upper plate 414 and lower plate 416 are shown as integrated with the body of the card holder and flush with the rear face of the back portion 10 and flush with the forward face of the front portion 20 of the body of the card holder. It is contemplated that the upper plate 414 and lower plate 416 may be separate components mounted, attached, or otherwise affixed to the body of the card holder, and that they may or may not be flush with the rear face of the back portion 10 and may or may not be flush with the forward face of the front portion 20 of the body of the card holder. It is also contemplated that there may be two or more pin joinder portions 410 and two or more hook joinder portions 420 on the body of the card holder in alternative non-limiting embodiments of the invention.

FIG. 4 illustrates a cross section view of the preferred card holder of FIG. 3 along horizontal line I. FIG. 5 illustrates a cross section view of the preferred card holder of FIG. 3 along vertical line II. In these cross section views, the slot 300 for receiving the interchangeable cards is illustrated between the back portion 10 of the body and the front portion 20 of the body and the aperture 500 for display of the interchangeable cards is illustrated. Further, FIG. 4 illustrates the symmetry of the pin and hook joinder mechanism 400 that allows two or more card holders to interlock. Also clear from these views is the large area of display 500 in the front portion 20 of the body for the interchangeable card. The absence of any barrier between the interchangeable card and the viewer allows for the direct display of a wide array of interchangeable cards, including interchangeable cards illustrated in relief. In alternative non-limiting embodiments of the invention, a portion of the back portion 10 of the body is removed to allow for insertion of interchangeable cards with relief on both sides of the card so long as the slot is maintained to hold the interchangeable card. The body as illustrated is made of a unitary design wherein the back portion 10 of the body and the front portion 20 of the body are integrally connected. In non-limiting alternative embodiments of the invention, it is also contemplated that the back portion 10 of the body and the front portion 20 of the body are separate structures made of the same of different materials that are attached to each other by glue, stitching, rivets, or other known methods of attachment (depending on the properties of the materials used) in such a way that a slot 300 is formed between the back portion 10 of the body and the front portion 20 of the body upon insertion of an interchangeable card. In non-limiting alternative embodiments of the invention, the joinder mechanism 400 is integral with, mounted, attached, or otherwise affixed to the back portion 10 of the body; the joinder mechanism 400 is integral with, mounted, attached, or otherwise affixed to the front portion 20 of the body; or the joinder mechanism 400 is integral with, mounted, attached or otherwise affixed to both the back portion 10 of the body and the front portion 20 of the body of the card holder.

Figure 6:
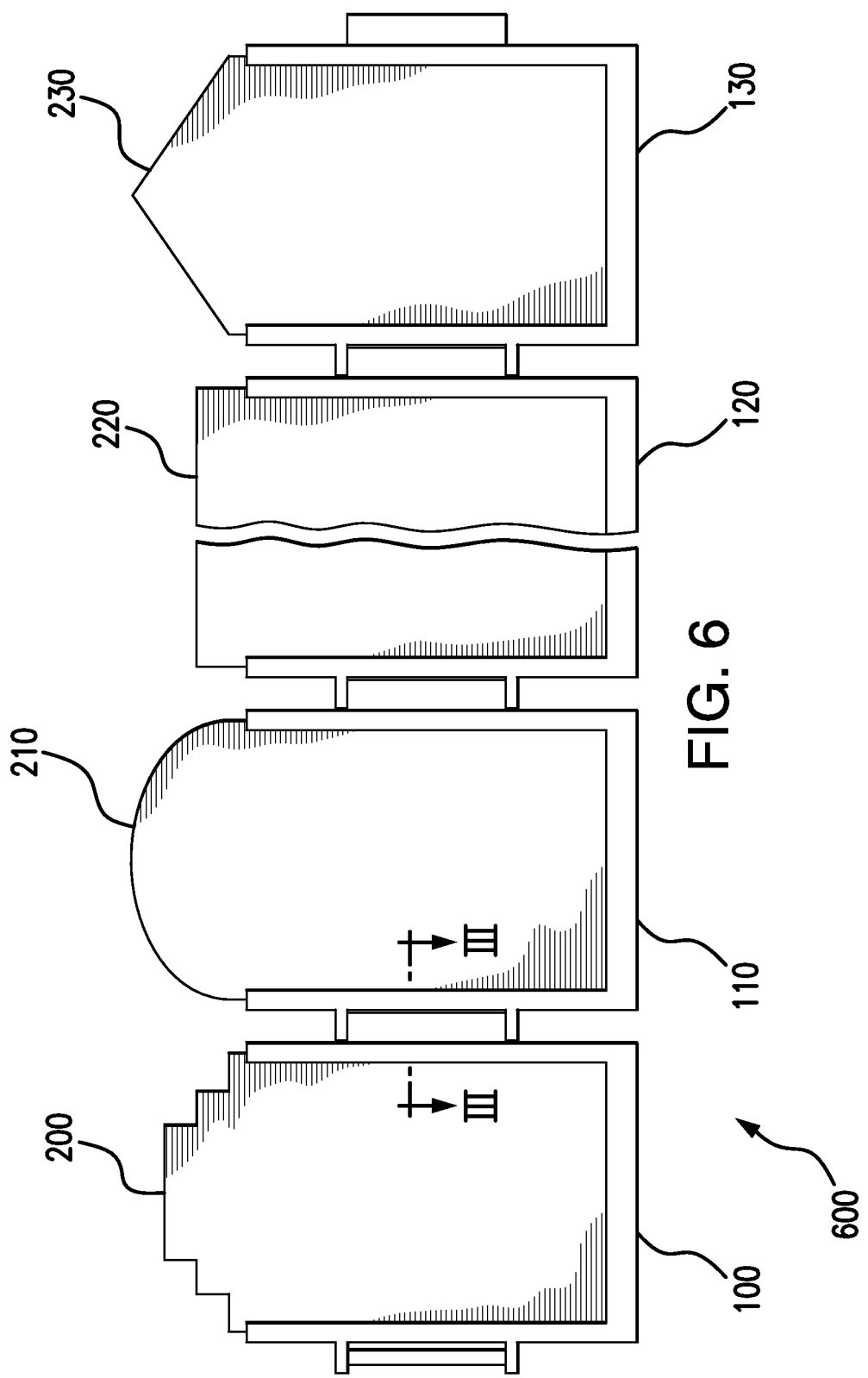
FIG. 6 is a front view of a band of card holders in accordance with a non-limiting embodiment of the present invention.

FIG. 6 illustrates a non-limiting embodiment of a preferred band 600 of card holders according to a non-limiting embodiment of the present invention. In this front view of a band 600 of card holders, multiple card holders 100, 110, 120, 130 are joined together using the preferred pin and hook joinder mechanism 400. Examples of interchangeable cards 200, 210, 220, 230 with different top portions are also illustrated. The band 600 of card holders can be assembled to any desired length and may be formed into a ring.

Figure 7:
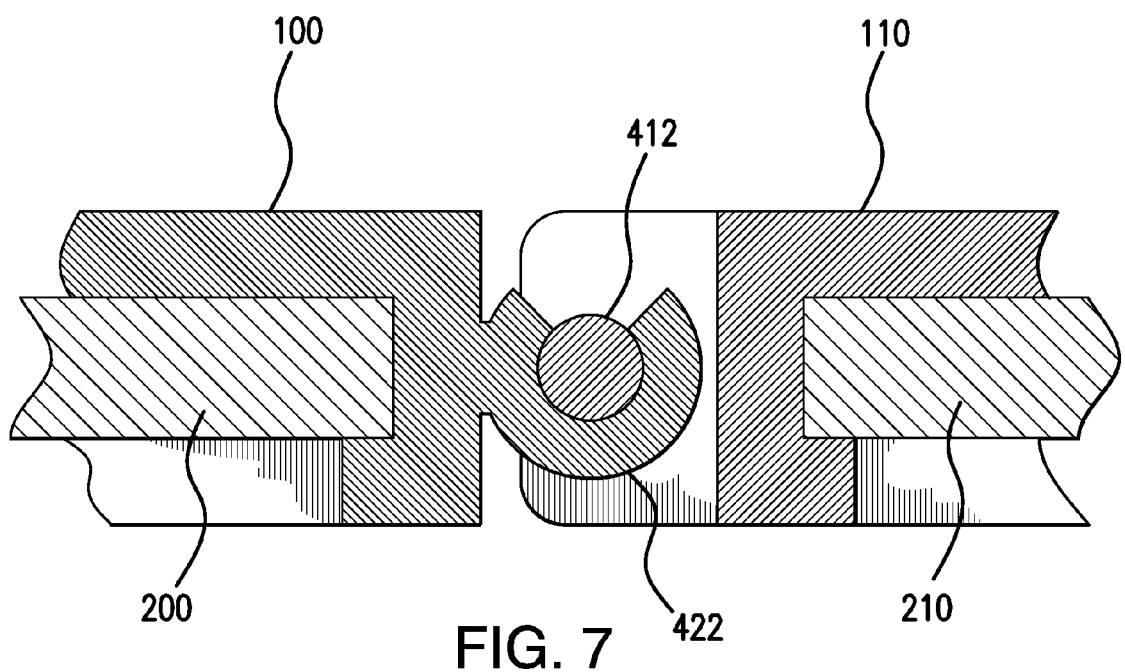
FIG. 7 is a partial cross section view of a pin and hook joinder mechanism of two card holders of FIG. 6 along horizontal line III.

FIG. 7 illustrates the preferred pin and hook joinder mechanism 400 of two card holders 100, 110 holding interchangeable cards 200, 210 of FIG. 6 in cross section view along horizontal line III of FIG. 6. As can be seen in this view, the pin and hook joinder mechanism allows the card holders 100, 110 to pivot relative to each other at the point of engagement of the pin and hook.

FIG. 8A illustrates a spacer component 700 in accordance with a non-limiting alternative embodiment of the present invention. Although the spacer component does not itself contain a slot for insertion of an interchangeable card, the spacer component has the mating pin joinder portion 410 and the mating hook joinder portion 420 of the card holders. The spacer component would be narrower than the card holder to provide unlimited flexibility in the design of a wearable band 600 of any size. For example, a spacer component can be made of varying predetermined widths, such as ¾ inch and 1½ inch in width, or be made of elastic material so that the width may be varied at the user's preference. FIG. 8B illustrates a spacer component 710 with an elastic material portion 712 in the body of the spacer component 710 between the pin joinder portion 410 and the hook joinder portion 420.

FIGS. 9A and 9B illustrate front views of closer components 800 in accordance with non-limiting alternative embodiments of the present invention. Although these closer components do not contain slots for insertion of an interchangeable card, each closer component 810, 820 has either the mating pin joinder portion 410 or the mating hook joinder portion 420, respectively, of the card holders. On the side opposite of the mating joinder mechanism on the closer component is an aesthetic end portion 430. The closer components 800 can also be designed to engage the mating joinder mechanism of more than one card holder, such as the closer components 830, 840 illustrated in FIG. 10.

Figure 10:
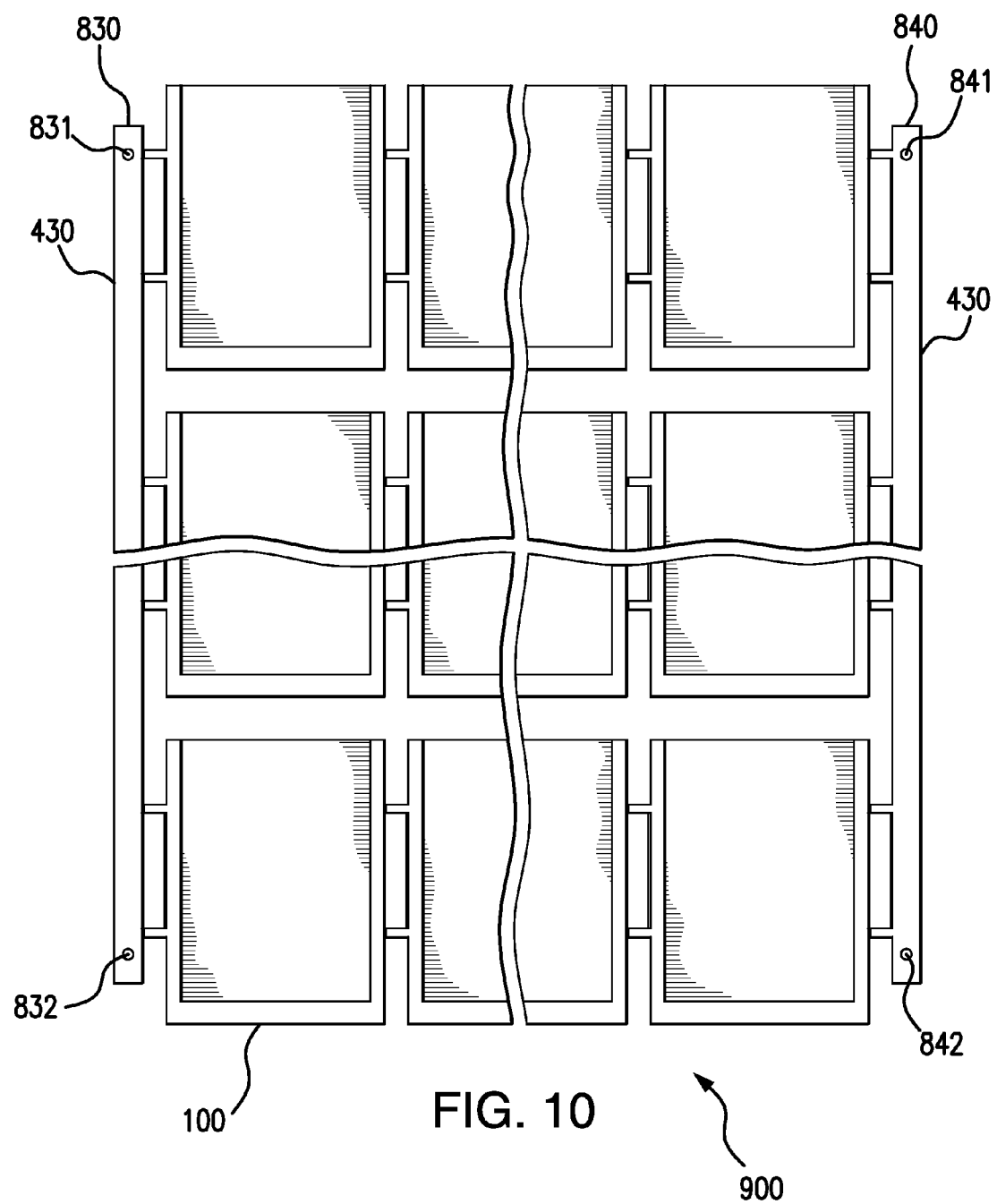
FIG. 10 is a front view of an array in accordance with a non-limiting alternative embodiment of the present invention.
Figure 13A:
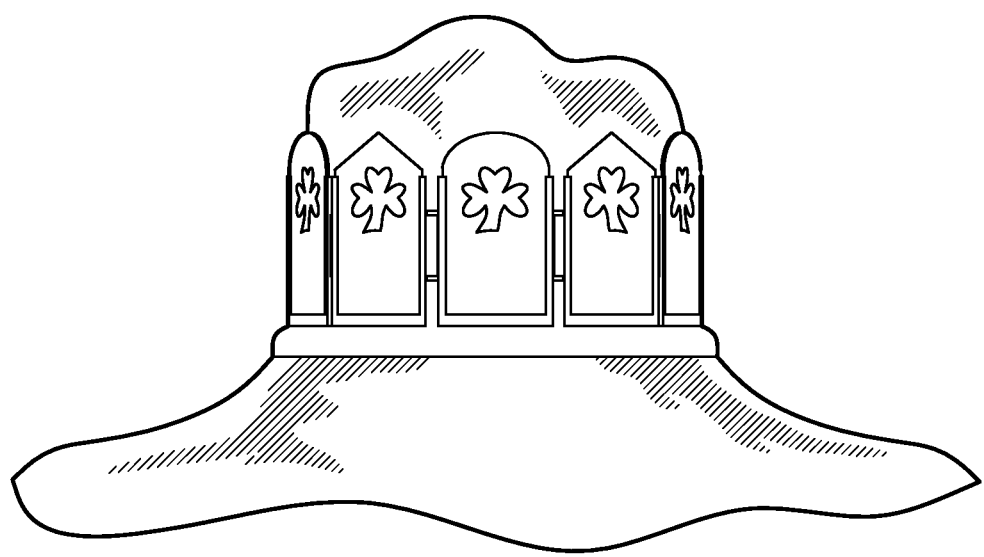
FIGS. 13A, 13B, and 13C are perspective views of a wearable band in contact with alternative types of hats in accordance with non-limiting embodiments of the present invention.
Figure 13B:
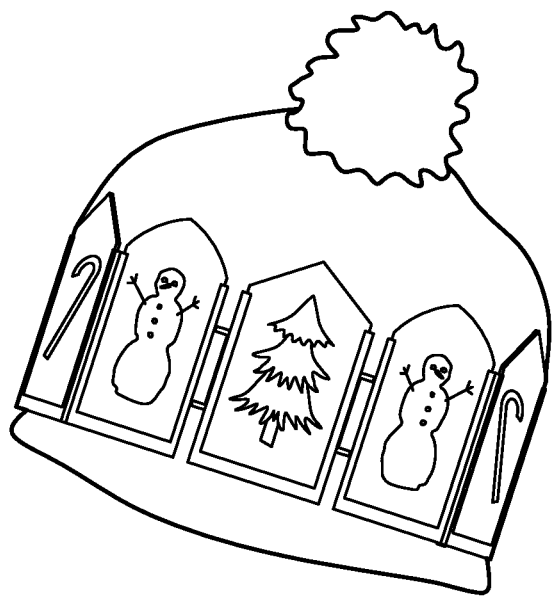
Figure 13C:
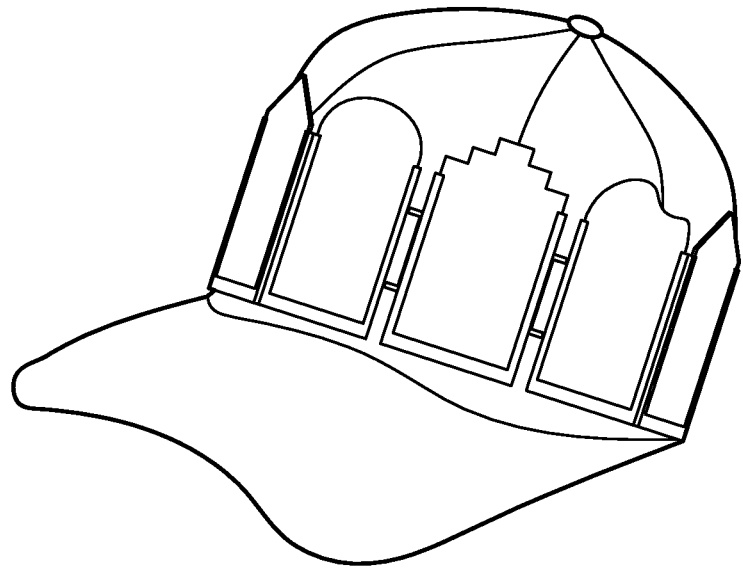
Figure 14:
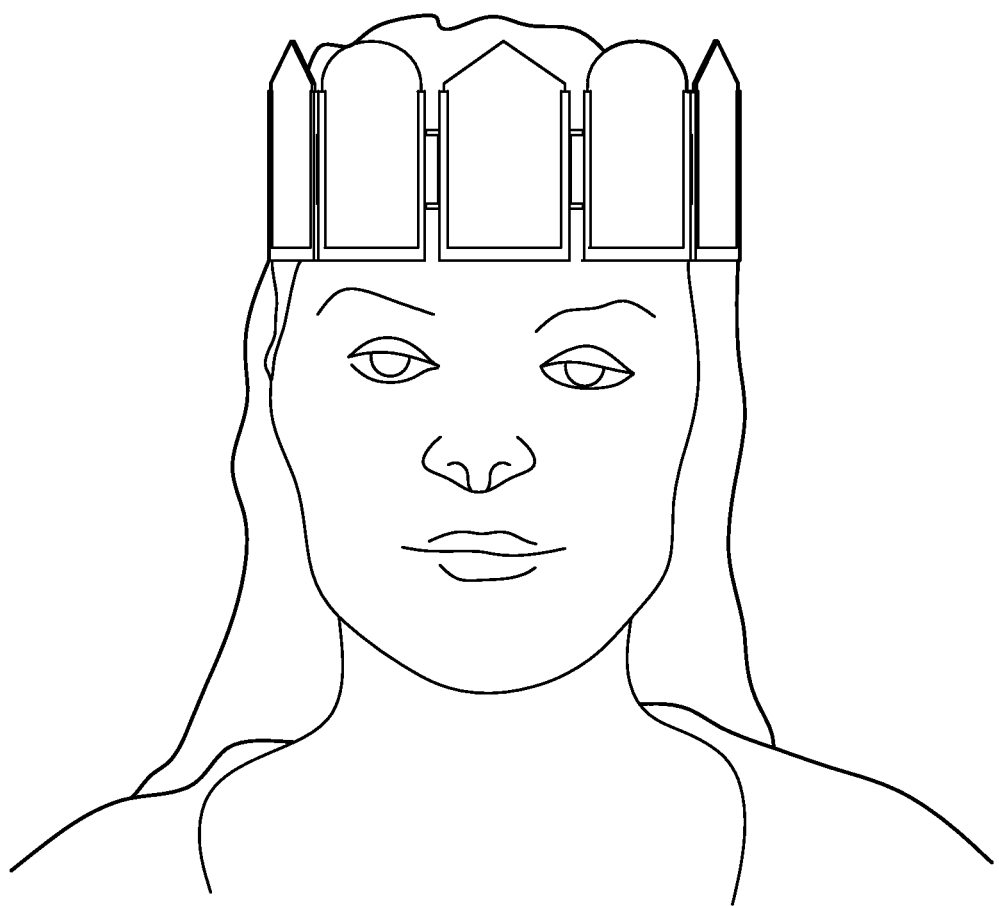
FIG. 14 is a perspective view of a wearable band around a wearer's head in accordance with a non-limiting embodiment of the present invention.
Figure 15:
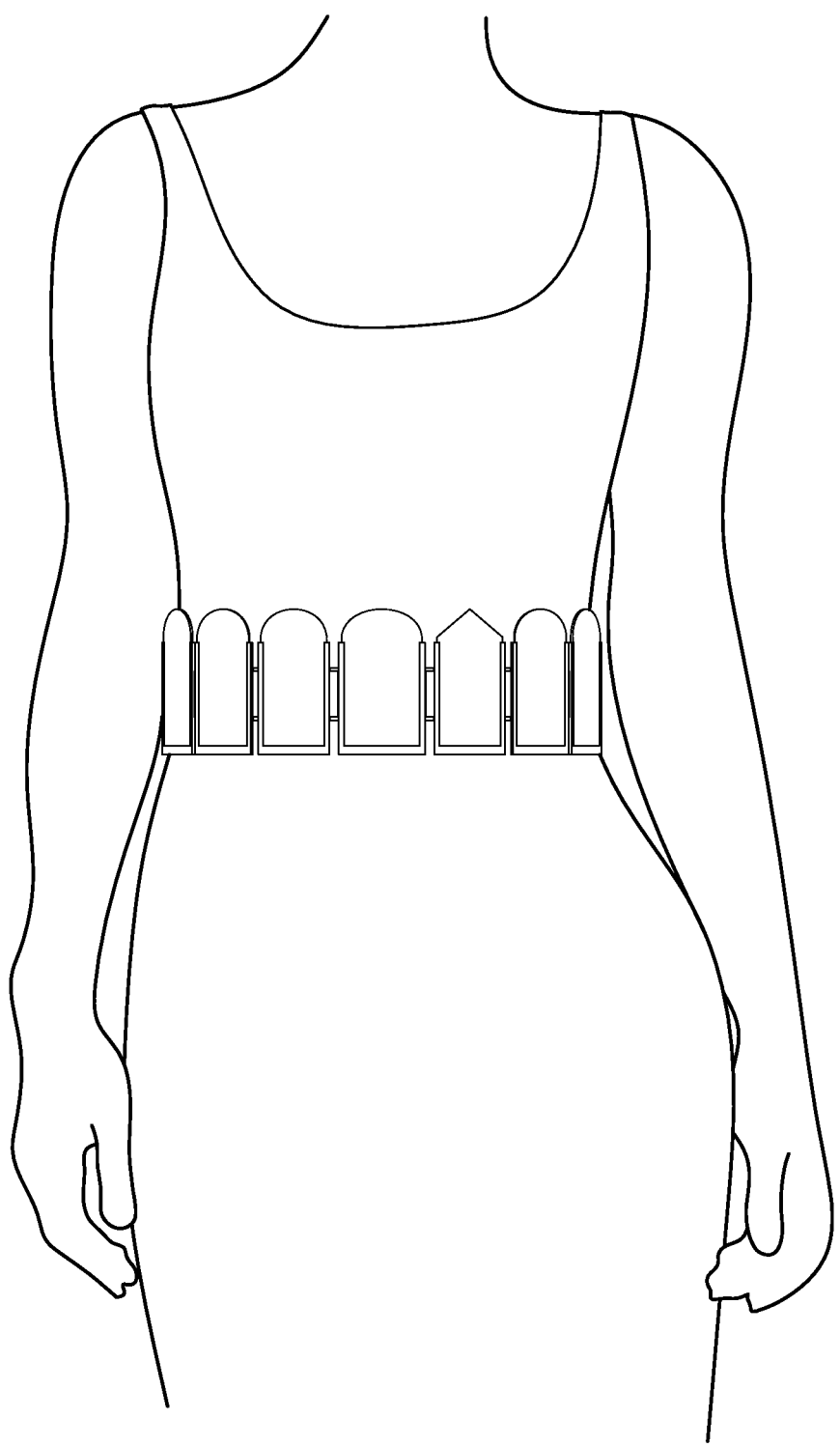
FIG. 15 is a perspective view of a wearable band around a wearer's waist in accordance with a non-limiting embodiment of the present invention.
Figure 16:
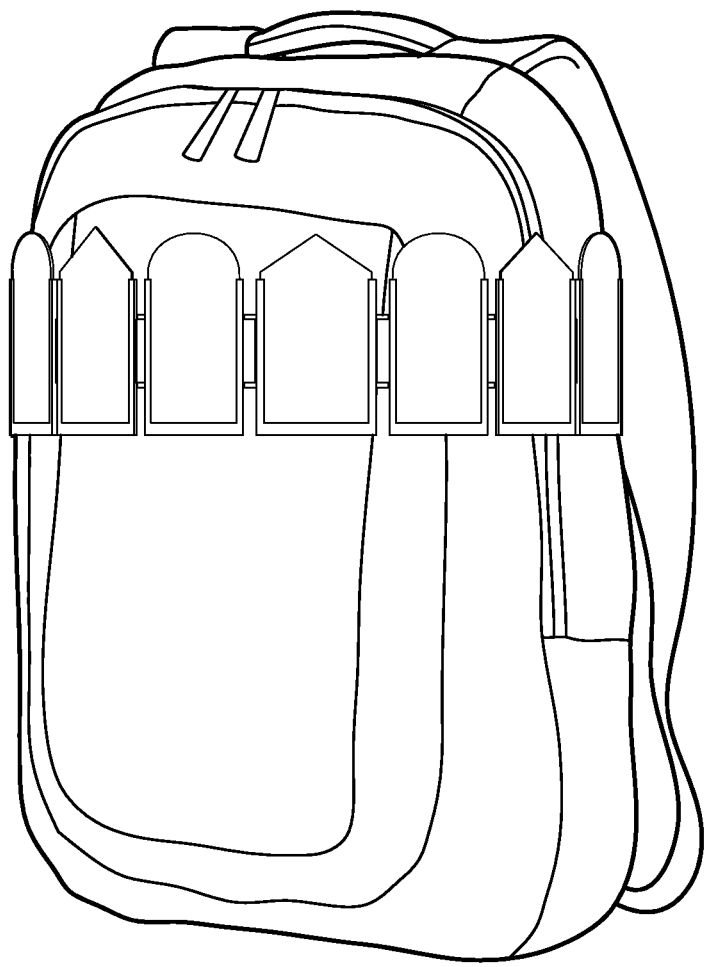
FIG. 16 is a perspective view of a wearable band around a backpack in accordance with a non-limiting embodiment of the present invention.

FIG. 10 illustrates an array 900 of bands of card holders 100 joined at either end by closer components 830, 840 in accordance with a non-limiting embodiment of the present invention. An array 900 of bands of card holders, horizontally and vertically, can be created by the use of more than one band in combination with closer components 830, 840 of varying lengths. For example, the closer components 830, 840 act as a frame for holding several bands of cards. The closer components 830, 840 may also have means for attaching 831, 832, 841, 842 an array to another array or a band to another band.

FIG. 11 illustrates a schematic front view of a single card holder 140 having more than one slot 310, 320, 330, 340 for holding more than one interchangeable card in accordance with a non-limiting alternative embodiment of the invention. In further non-limiting alternative embodiments of the invention, a card holder slot has one or more electrical contact pads 311, 321, 331, 341 for electrical connection 350 to one or more electrical contact pads in another card holder slot. These electrical contact pads are ports for electrical engagement with either a solar energy generating interchangeable card 240, an illumination interchangeable card 250, or a non-illumination interchangeable card 200, 210, 220.

FIGS. 12A and 12B are front and rear views, respectively, of an exemplary solar energy generating interchangeable card 240 in accordance with a non-limiting alternative embodiment of the present invention. The solar energy generating interchangeable card 240 may have one or more solar panels. Energy collected by the solar panels can then be used to power an illumination interchangeable card 250.

FIGS. 12C and 12D illustrate front and rear views, respectively, of an exemplary illumination interchangeable card 250 that is powered by electrical current from an electrical contact port 251, 252 on the interchangeable card in accordance with a non-limiting alternative embodiment of the present invention. The entire card, or a portion of the card, may illuminate. In another alternative non-limiting embodiment of the invention, the power source for the illumination interchangeable card is from a power source other than solar energy. In another alternative non-limiting embodiment of the invention, the power source for an illumination interchangeable card is from a battery inside the card.

In another alternative embodiment of the present invention, a single solar energy generating interchangeable card in a first card holder with a single slot provides electrical current to an illumination interchangeable card in a second card holder with a single slot by way of electrical contact ports on the first and second card holder. Preferably, the electrical contact ports would be incorporated into the pin and hook of the pin hook joinder mechanism.

In non-limiting embodiments of the present invention, a wearable band may be worn on an article of clothing, such as a hat, shirt, coat, pant, etc., without being attached or affixed to the article of clothing. The band may also be worn on a portion of a wearer's body, such as on the head without a hat (like a headband), or on an arm, leg, chest or waist, as well as on accessories, such as backpacks or handbags. Non-limiting embodiments of the present invention are illustrated in FIGS. 13 to 16.

Figure 17D:
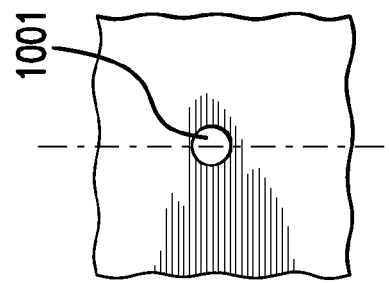
FIG. 17D is a rear view of a portion of the interchangeable card of FIG. 17B.
Figure 17C:
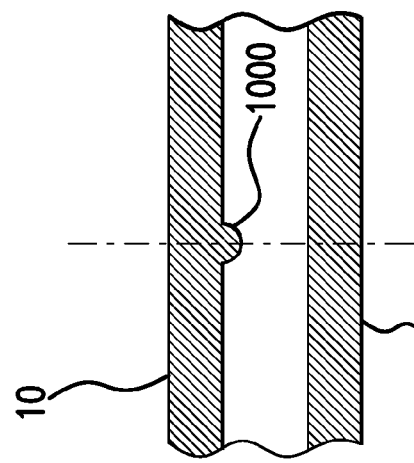
FIG. 17C is a horizontal cross section view of a portion of the bottom of the card holder of FIG. 17A showing the raised dome.
Figures 17A, 17B:
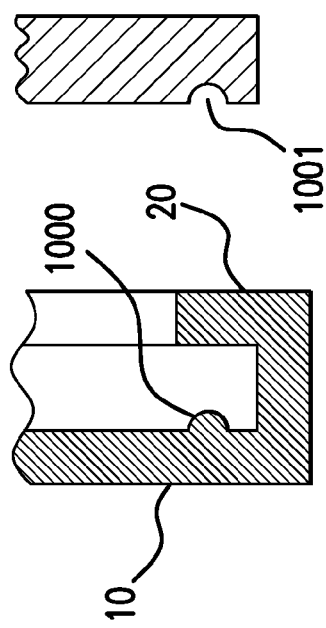
FIGS. 17A and 17B are cross section views of a portion of a card holder having a raised dome and a portion of an interchangeable card having a mating indentation, respectively, to secure the interchangeable card to the card holder in accordance with non-limiting alternative embodiments of the present invention.

FIG. 17A is a vertical cross section view of a portion of a card holder according to a non-limiting alternative embodiment of the invention having a mechanism for securing an interchangeable card to the card holder. Extending into the slot from back portion 10 of the body is a raised dome 1000 to come into contact with an interchangeable card upon insertion of the card into the slot. The raised dome 1000 could be positioned in any location on the body portion so long as the raised dome 1000 extends into the slot. In a preferred non-limiting embodiment of the invention, the raised dome 1000 is located at or near the center and bottom of the body portion of the card holder. FIG. 17B shows a vertical cross section view of a portion of an interchangeable card according to a further non-limiting alternative embodiment of the invention, wherein the interchangeable card has an indentation 1001 for securing the interchangeable card to the card holder. The indentation 1001 could be positioned in any location on the interchangeable card. In a preferred non-limiting embodiment of the invention, the indentation 1001 is located at or near the center and bottom of the interchangeable card for contact in a mating position with the raised dome 1000 of the card holder of FIG. 17A. FIG. 17C is a horizontal cross section view of the card holder of 17A showing the raised dome 1000 extending into the slot. FIG. 17D is a rear elevation view of the interchangeable card of FIG. 17B showing the indentation 1001 in a mating position with the raised dome 1000 of the card holder of FIG. 17C.

Figure 19A:
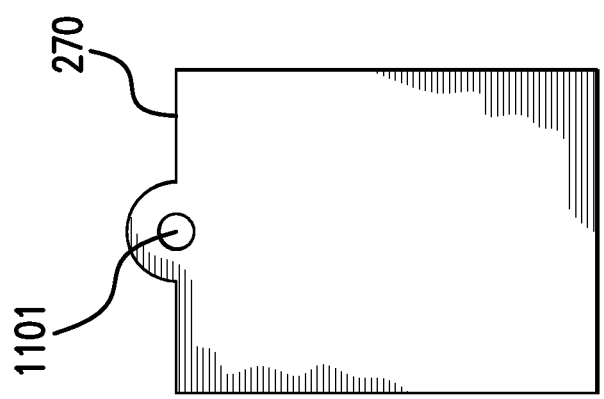
FIG. 19A is a front view of an interchangeable card and FIGS. 19B to 19D are front views of wearable bands of interchangeable cards capable of displaying accessories in accordance with non-limiting alternative embodiments of the present invention.
Figure 19B:
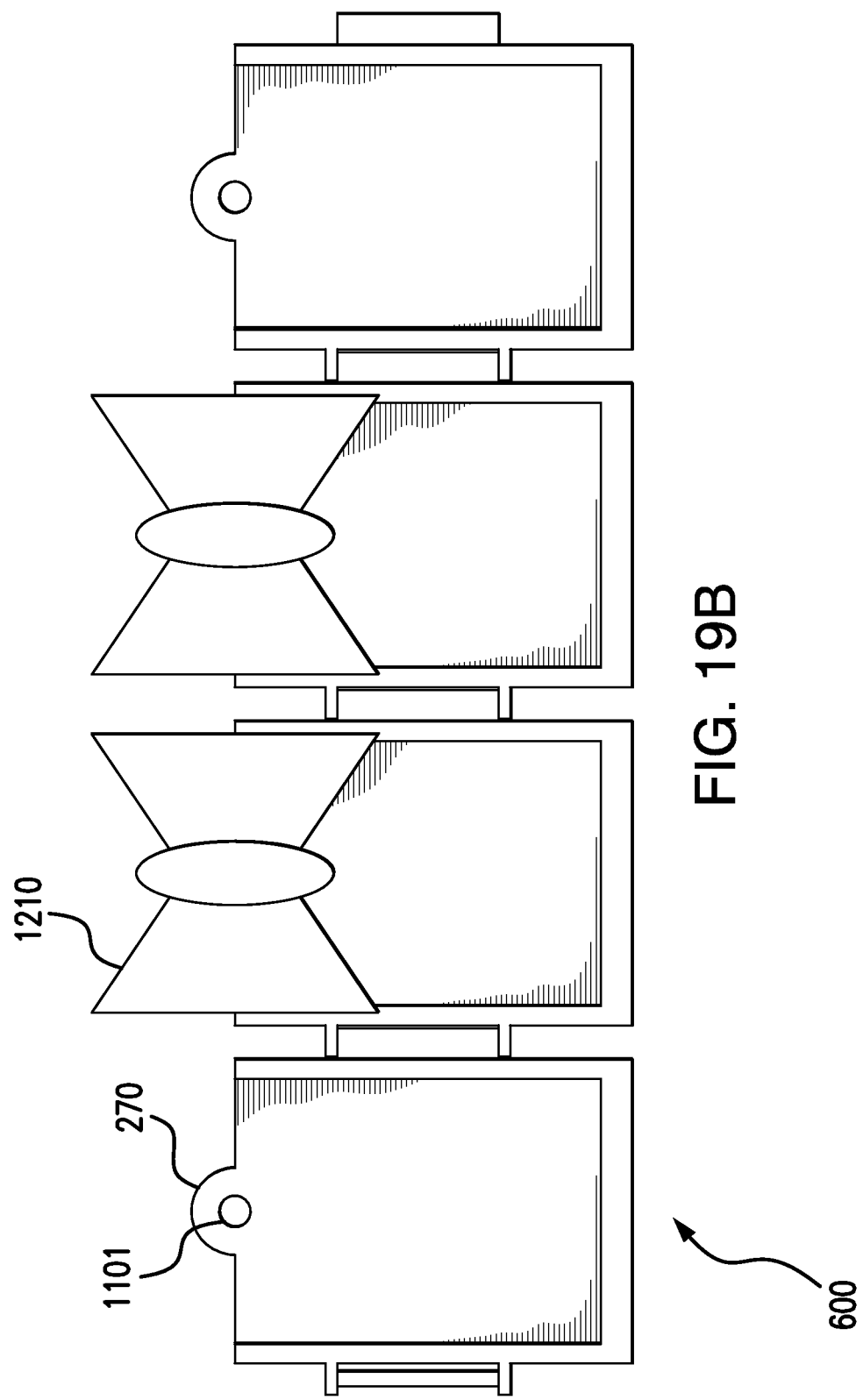
Figure 19C:
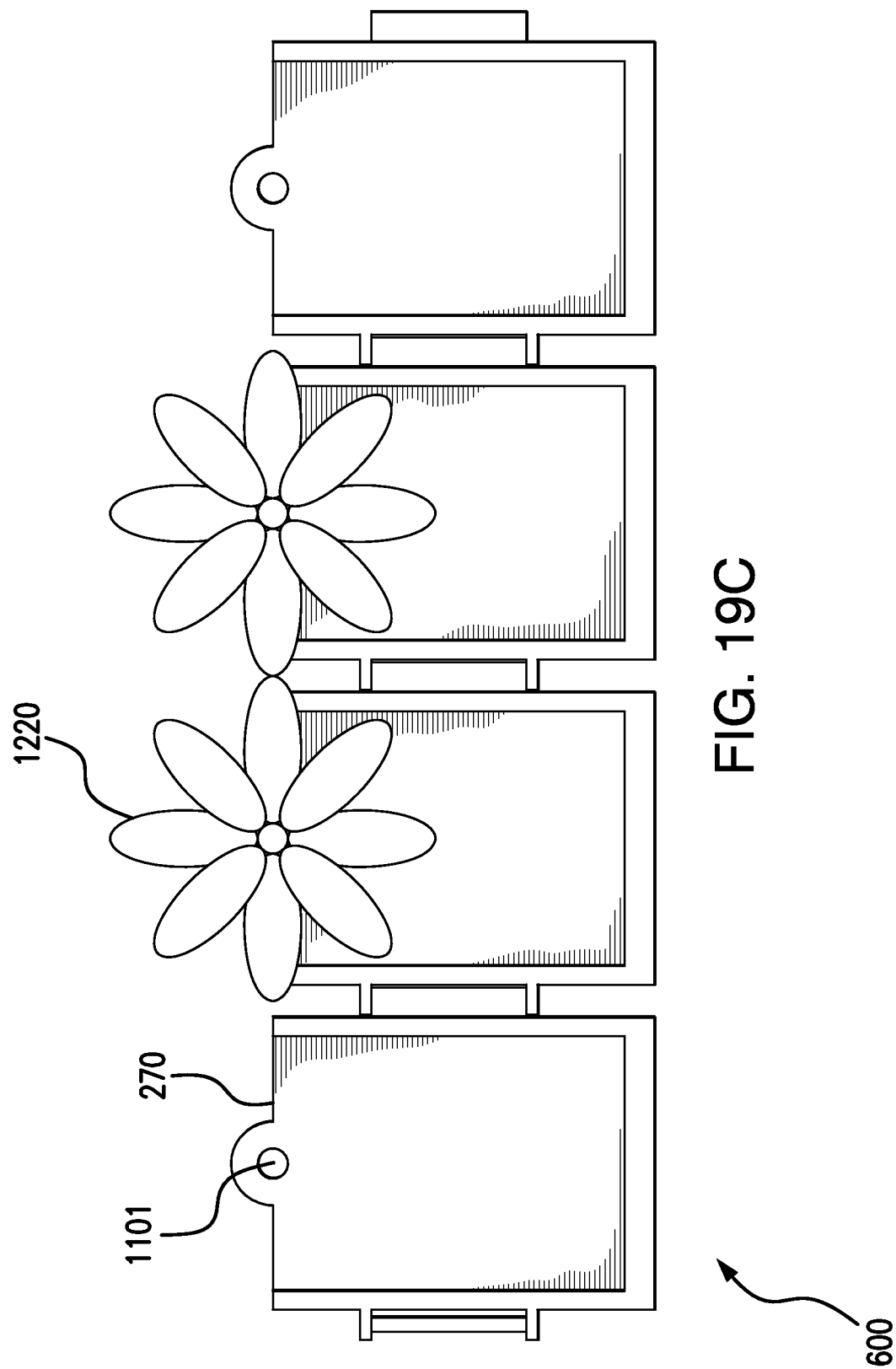
Figure 19D:
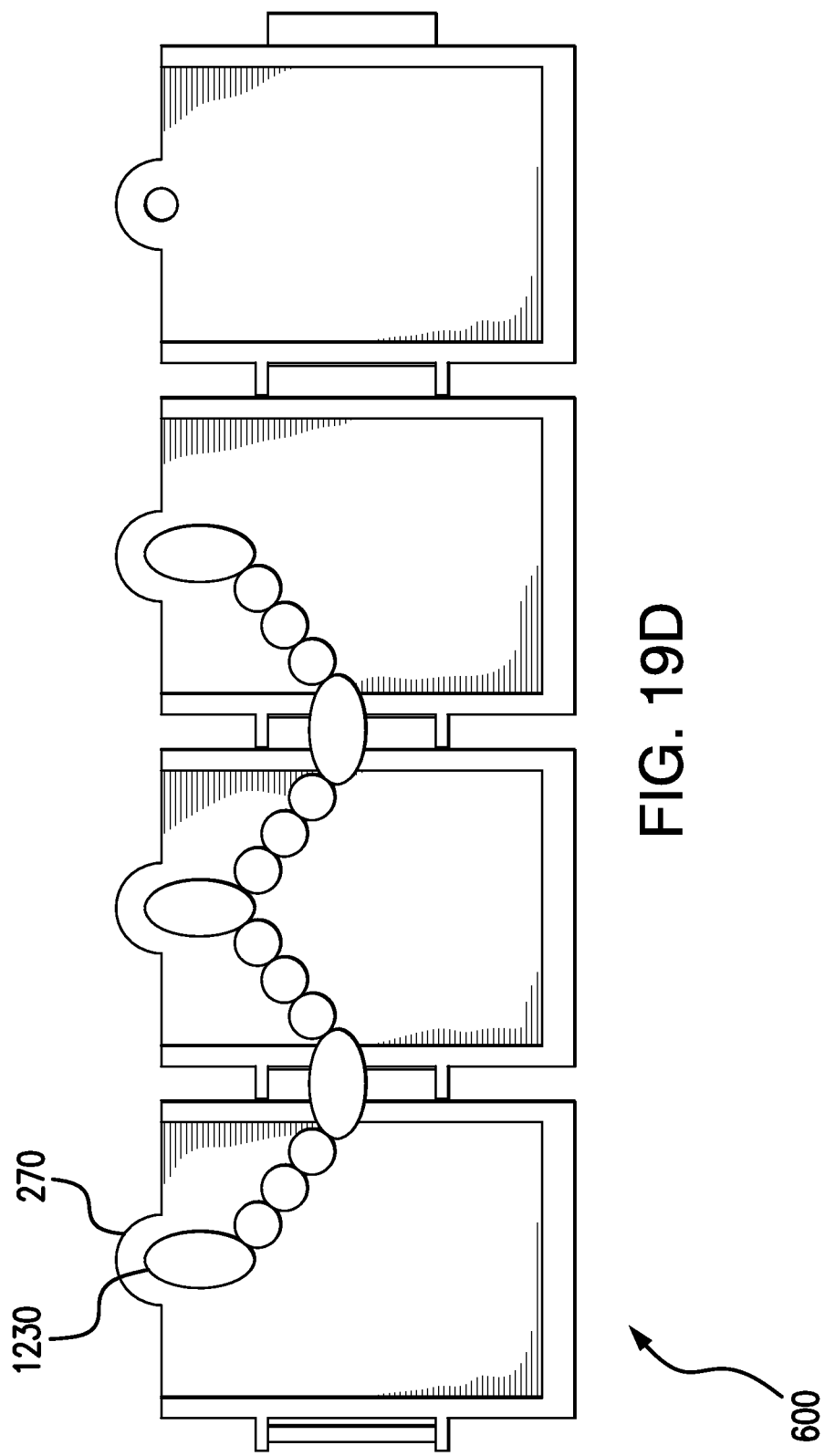

In non-limiting alternative embodiments of the present invention, the interchangeable cards can be accessorized with one or more accessories by securing them to one or more holes in the interchangeable cards. FIGS. 18A and 19A are front elevation views of interchangeable cards each having a hole 1100, 1101 through the card 260, 270, respectively, for the insertion of a post to secure the display of an accessory. On the reverse side of the interchangeable card, a clasp can be used to engage the inserted post and secure the accessory. FIGS. 18B and 19B to 19D illustrate, by way of non-limiting alternative examples, accessories 1200, 1210, 1220, 1230. Also illustrated in FIG. 19D is a non-limiting alternative embodiment of an accessory that is displayed by securing it to more than one interchangeable card.

The invention is not restricted to the embodiments described, but, on the contrary, covers any modification on form and any alternative form of embodiment that falls within the scope and spirit of the present invention. While there have been described what are believed to be preferred embodiments of the invention, those skilled in the art will recognize that other and further modifications may be made thereto, without departing from the spirit of the present invention.

What is claimed is:

1. A card holder for personalized display of interchangeable cards comprising:
a body portion having a first side, a second side opposite the first side, two or more slots for slideably receiving the interchangeable cards, and two or more apertures for direct display of the two or more interchangeable cards, and a pin and hook joinder mechanism connected to the body portion for joining the card holder to another card holder, wherein at least one slot is configured with one or more electrical contact pads for electrical contact with at least one solar energy generating interchangeable card.

2. A card holder for personalized display of interchangeable cards comprising:

a body portion having a first side, a second side opposite the first side, a slot for slideably receiving the interchangeable card, and an aperture for direct display of the interchangeable card, a pin and hook joinder mechanism connected to the body portion for joining the card holder to another card holder, and a first electrical contact pad within the slot for slideably receiving the interchangeable card for electrical engagement of the first electrical contact pad with an interchangeable card having an electrical contact pad, and a second electrical contact pad within the pin and hook joinder mechanism for electrical engagement with another card holder having an electrical contact pad, wherein the first electrical contact pad is electrically connected to the second electrical contact pad.

3. The card holder of claim 2, wherein the interchangeable card is an illumination interchangeable card powered by an internal battery.

* * * * *